(12) United States Patent
Fifield et al.

(10) Patent No.: US 8,990,478 B2
(45) Date of Patent: Mar. 24, 2015

(54) PROTECTION OF ONE-TIME PROGRAMMABLE (OTP) MEMORY

(75) Inventors: John A. Fifield, Underhill, VT (US); Gerald P. Pomichter, Jr., Fairfax, VT (US); Jeffrey S. Zimmerman, Swanton, VT (US)

(73) Assignee: International Business Machines Corporation, Armonk, NY (US)

(*) Notice: Subject to any disclaimer, the term of this patent is extended or adjusted under 35 U.S.C. 154(b) by 289 days.

(21) Appl. No.: 13/555,412

(22) Filed: Jul. 23, 2012

(65) Prior Publication Data

US 2014/0025915 A1    Jan. 23, 2014

(51) Int. Cl.
*G06F 12/14* (2006.01)
*G11C 16/00* (2006.01)

(52) U.S. Cl.
CPC ............ *G06F 12/1458* (2013.01); *G11C 16/00* (2013.01)
USPC ................. 711/103; 365/185.04; 365/185.33; 326/8; 326/37; 713/182; 713/183; 713/184; 713/185; 713/186

(58) Field of Classification Search
CPC .............. G06F 12/0246; G06F 3/0679; G06F 2212/2022
USPC .......... 711/103; 365/185.04, 185.33, 94, 113, 365/115, 148; 326/38–41, 8; 713/182–194
See application file for complete search history.

(56) References Cited

U.S. PATENT DOCUMENTS

| | | | |
|---|---|---|---|
| 7,129,769 B2 | 10/2006 | Dixon et al. | |
| 7,321,522 B2 | 1/2008 | Dixon et al. | |
| 7,486,585 B2 | 2/2009 | Dixon et al. | |
| 7,742,357 B2 | 6/2010 | Dixon et al. | |
| 7,936,582 B1 | 5/2011 | Zhou et al. | |
| 7,949,136 B2 | 5/2011 | Choi et al. | |
| 7,978,549 B2 | 7/2011 | Jeong | |
| 2009/0009455 A1* | 1/2009 | Kimura ........................... 345/89 |

* cited by examiner

*Primary Examiner* — Jared Rutz
*Assistant Examiner* — Mehdi Namazi
(74) *Attorney, Agent, or Firm* — David A. Cain; Hoffman Warnick LLC (57) ABSTRACT

Aspects of the invention provide for masking a current profile of a one-time programmable (OTP) memory. In one embodiment, a circuit includes: a first one-time programmable (OTP) memory configured to receive a data input for a plurality of address fields; and a second OTP memory configured to receive an inverse of the data input for a plurality of address fields, wherein a current profile for a programming supply for the first OTP memory and the second OTP memory is masked, such that the data input for the first OTP memory is undetectable.

14 Claims, 9 Drawing Sheets

PROTECTION OF ONE-TIME PROGRAMMABLE (OTP) MEMORY

FIELD OF THE INVENTION

The disclosure relates generally to one-time programmable (OTP) memories, and more particularly, to protecting information stored in an OTP memory.

BACKGROUND

An electronic fuse (eFUSE) is normally used to configure elements after the silicon masking and fabrication process. These fuses typically are used to configure circuits for customization or to correct silicon manufacturing defects and increase manufacturing yield.

As the use of eFUSEs increases, the potential use is expanding into the application area. For example, a given application may have a pool of eFUSEs that may be viewed as One-Time Programmable (OTP) memory. In the case of a central processor unit (CPU) accessing the OTP memory, the memory elements are initially all not blown and a program running on the CPU may execute commands to do so by forcing current through a fusable link.

Confidential information programmed in an eFUSE can be hacked by observing a current waveform on the programming supply during programming.

BRIEF SUMMARY

Aspects of the invention provide for masking a current profile of a one-time programmable (OTP) memory. In one embodiment, a circuit includes: a first one-time programmable (OTP) memory configured to receive a data input for a plurality of address fields; and a second OTP memory configured to receive an inverse of the data input for a plurality of address fields, wherein a current profile for a programming supply for the first OTP memory and the second OTP memory is masked, such that the data input for the first OTP memory is undetectable.

A first aspect of the disclosure provides a circuit, comprising: a first one-time programmable (OTP) memory configured to receive a data input for a plurality of address fields; and a second OTP memory configured to receive an inverse of the data input for a plurality of address fields, wherein a current profile for a programming supply for the first OTP memory and the second OTP memory is masked, such that the data input for the first OTP memory is undetectable.

A second aspect of the disclosure provides a one-time programmable (OTP) memory, comprising: an address input field; and a data input field, wherein the data input field receives a data input, and a portion of the address input field receives an inverse of the data input.

A third aspect of the disclosure provides a one-time programmable (OTP) memory, comprising: a data input field; a programming capacitor; a fuse source (FS) voltage for charging the programming capacitor; and a discharge resistor for discharging the programming capacitor, wherein a current profile for the FS voltage is a continuous charge-discharge cycle, such that a data input for the data input field is undetectable.

BRIEF DESCRIPTION OF THE DRAWINGS

The above and other aspects, features and advantages of the disclosure will be better understood by reading the following more particular description of the disclosure in conjunction with the accompanying drawings.

FIG. 1B shows a waveform sequence for a conventional OTP memory.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

As mentioned above, the disclosure relates generally to one-time programmable (OTP) memories, and more particularly, to protecting information stored in an OTP memory.

An electronic fuse (eFUSE) is normally used to configure elements after the silicon masking and fabrication process. These fuses typically are used to configure circuits for customization or to correct silicon manufacturing defects and increase manufacturing yield.

As the use of eFUSEs increases, the potential use is expanding into the application area. For example, a given application may have a pool of eFUSEs that may be viewed as One-Time Programmable (OTP) memory. In the case of a central processor unit (CPU) accessing the OTP memory, the memory elements are initially all not blown and a program running on the CPU may execute commands to do so by forcing current through a fusable link.

Confidential information programmed in an eFUSE can be hacked by observing a current waveform on the programming supply during programming. Prior art solutions provide for consuming a ballast current in excess of what is needed by the eFUSE, and diverting a portion of that current into a fuse programming when needed. An op-amp circuit is arranged with negative feedback, such that the sum of fuse current and ballast current is constant. One problem with this solution is power consumption. Hand-held devices cannot afford to waste battery power in a ballast resistor. Another problem is the operability, which relies in part on the response time of the op-amp circuit. It takes a measurable amount of time to sense the on-set of a fuse programming circuit and react by reducing the current into a ballast resistor.

Figure 1A:
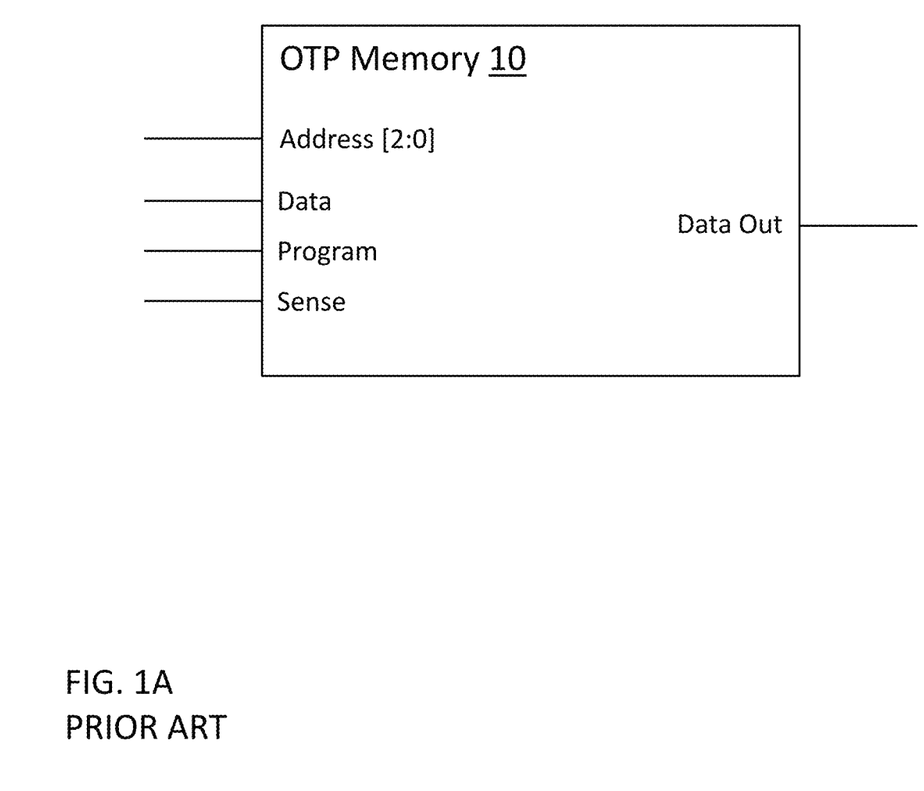
FIG. 1A shows a schematic view of a conventional OTP memory.

Turning now to the figures, FIG. 1A shows a conventional one-time programmable (OTP) memory 10 and FIG. 1B shows a corresponding waveform sequence 12 for conventional OTP memory 10. In the conventional OTP memory 10 shown in FIG. 1A, data is programmed into the data input field "Data." As shown in the waveform 12 of FIG. 1B, "data" is a logic high "1" in Addr 0 and Addr 3. The current profile ("Vdd current") at Addr 0 and Addr 3 show that data is programmed in those address fields. Therefore, the confidential data programmed into conventional OTP memory 10 is detectable.

Aspects of the invention provide for masking a current profile of a one-time programmable (OTP) memory. In one embodiment, a circuit includes: a first one-time programmable (OTP) memory configured to receive a data input for a plurality of address fields; and a second OTP memory configured to receive an inverse of the data input for a plurality of address fields, wherein a current profile for a programming supply for the first OTP memory and the second OTP memory is masked, such that the data input for the first OTP memory is undetectable. Therefore, secure and confidential data programmed into the eFUSE cannot be detected.

It is understood that the embodiments of the invention shown herein are not limited to a particular capacity for the OTP memory, and that the embodiments shown in the figures are for exemplary purposes only. That is, the embodiments of the OTP memory according to this disclosure are applicable to OTP memories of varying capacities.

Figure 2A:
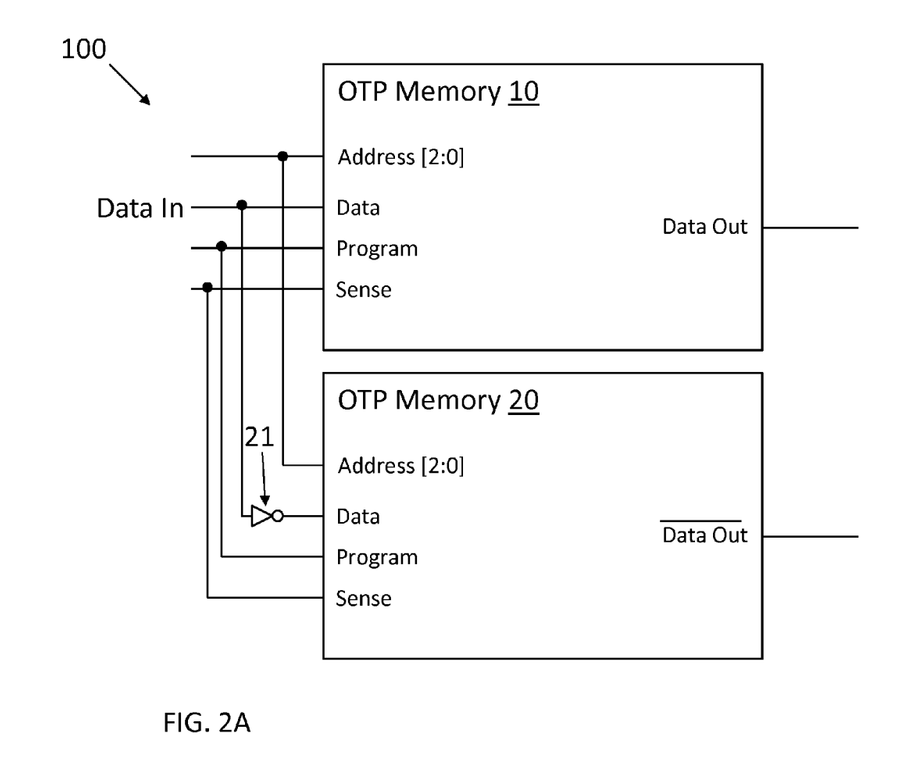
FIG. 2A shows a schematic view of an OTP memory according to embodiments of the invention.

Turning now to FIG. 2A, a schematic view of a circuit 100 according to embodiments of the invention is shown. Circuit 100 a first OTP memory 10 (similar to conventional OTP memory 10 shown in FIG. 1A) configured to receive a data input ("Data In") at a data input field ("Data") for a plurality of address field ("Address [2:0]"). Circuit 100 also includes a second OTP memory 20, which is a dummy OTP memory. That is, second OTP memory 20 is configured to receive an inverse of "Data In" (via inverter 21). However, first OTP memory 10 and second OTP memory 20 receive the same address field input ("Address [2:0]"), program input ("Program"), and sense input ("Sense"). A valid data output ("Data Out") is received from the first OTP memory 10, while the inverse of the valid data output is received from the second OTP memory 20.

Figure 2B:
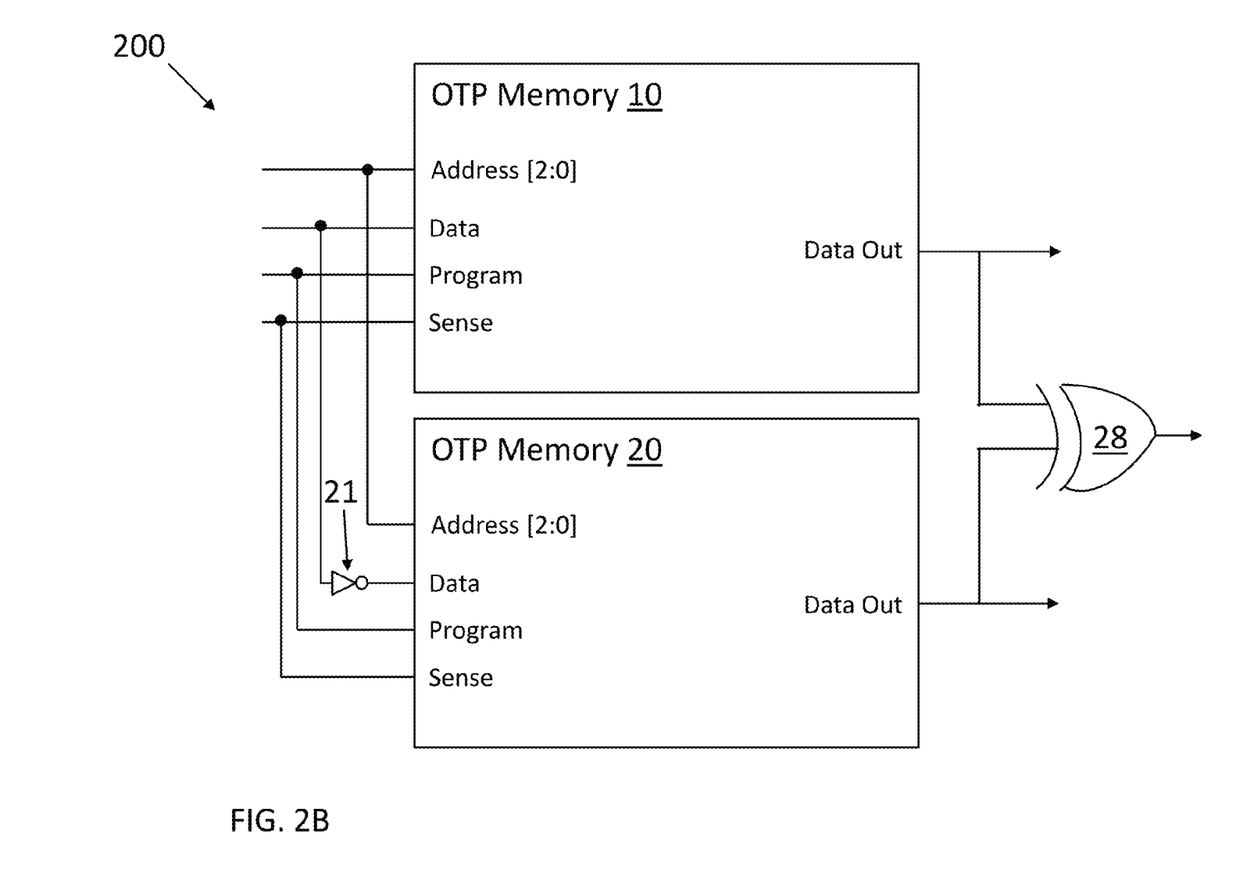
FIG. 2B shows a schematic view of an OTP memory according to embodiments of the invention.
Figure 2C:
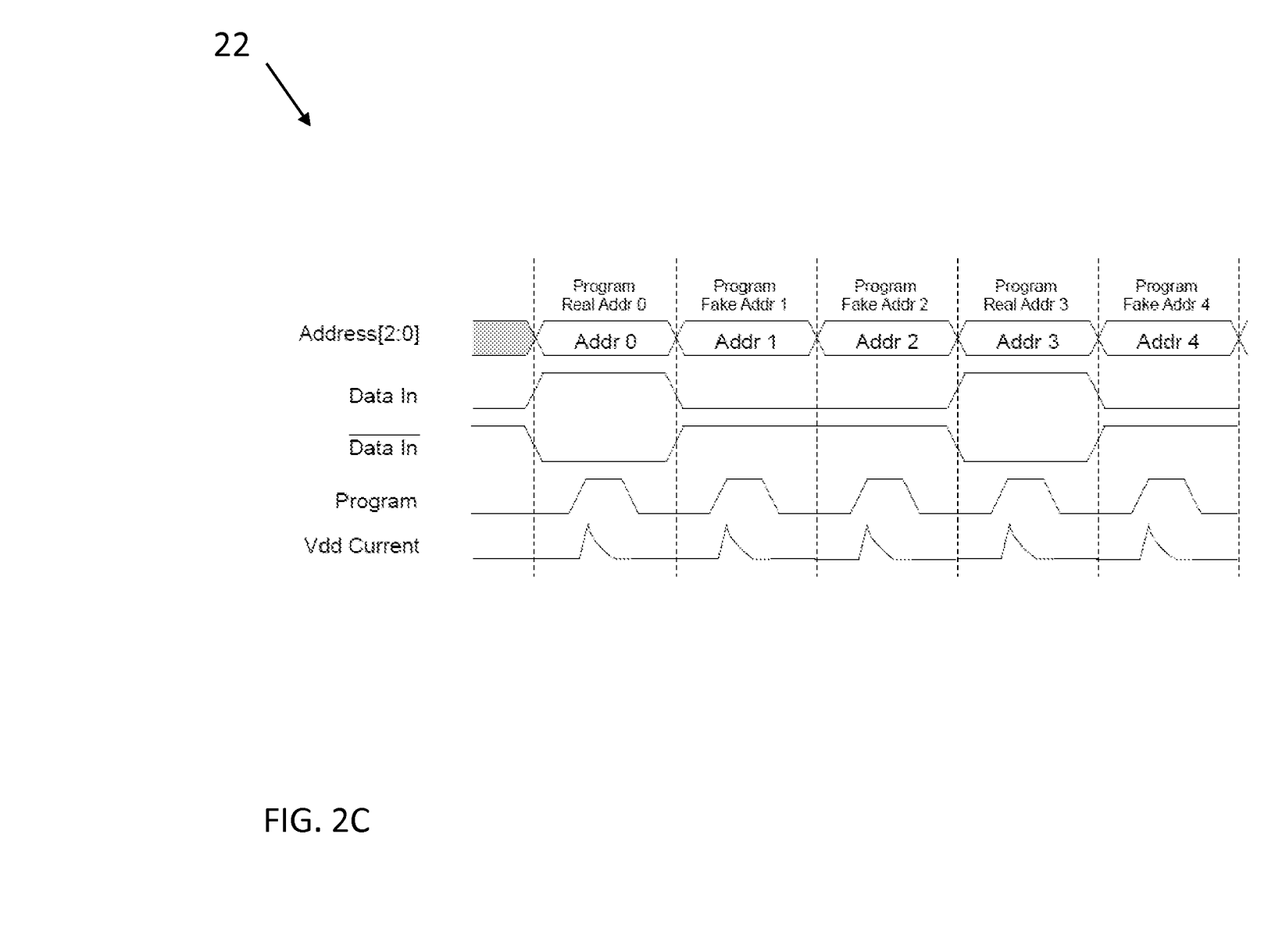
FIG. 2C shows a waveform sequence for an OTP memory according to embodiments of the invention.

Turning now to FIG. 2C, a waveform sequence 22 for circuit 100 (and circuit 200, described later herein) is shown. "Data In" programs data into Addr 0 and Addr 3. However, the inverse of "Data In" programs data into Addr 1, Addr 2, and Addr 4 for second OTP memory 20. Therefore, as shown in the waveform sequence 22, the current profile ("Vdd current") is the same for every address field. The current profile ("Vdd current") for both first OTP memory 10 and second OTP memory 20 is masked, such that "Data In" for first OTP memory 10 (and second OTP memory 20) is undetectable.

Turning now to FIG. 2B, a circuit 200 according to embodiments of the invention is shown. Circuit 200 is similar to circuit 100 shown in FIG. 2A, and includes both first OTP memory 10 and second OTP memory 20, where second OTP memory 20 receives the inverse "Data In" of first OTP memory 10. However, a logic gate 28 (shown as an XOR gate) is configured to receive a data output of first OTP memory 10 and a data output of second OTP memory 20. The output of the logic gate 28 is used to verify that the data output of first OTP memory 10 is valid. For example, the data output of first OTP memory 10 and the data output of second OTP memory 20 should always be the inverse of one another. Therefore, the output of logic gate 28 should be a consistent logic high "1."

Figure 3A:
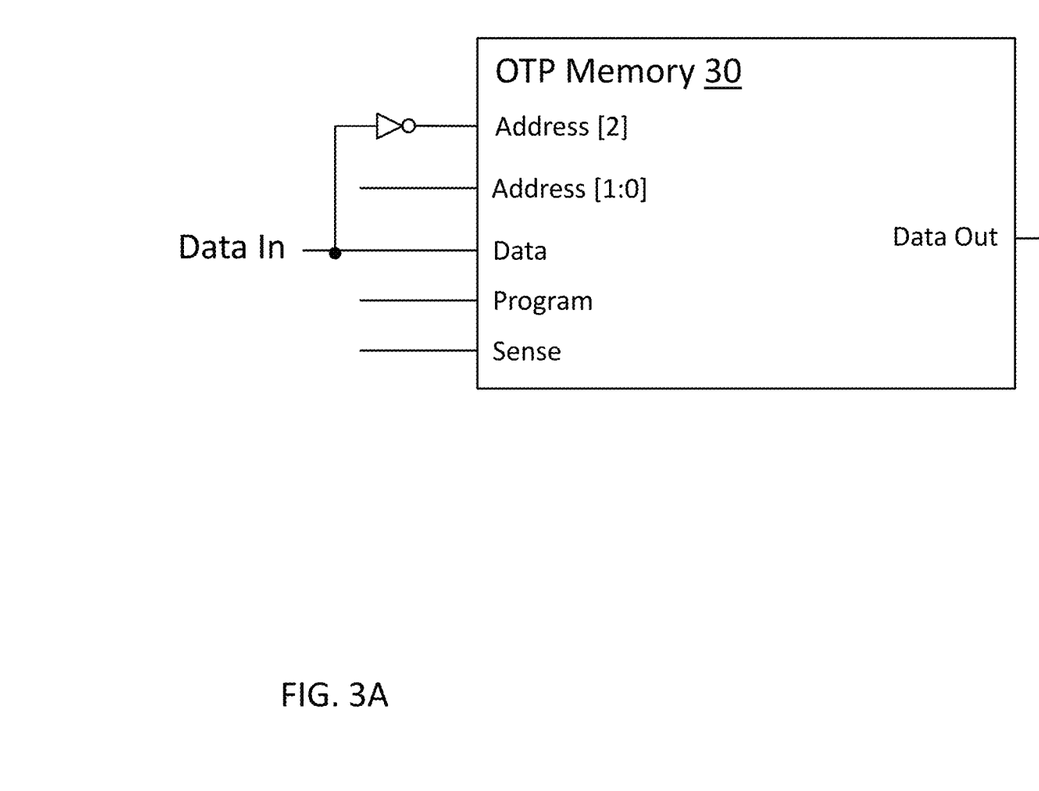
FIG. 3A shows a schematic view of an OTP memory according to embodiments of the invention.

Turning now to FIG. 3A, a schematic view of an OTP memory 30 according to embodiments of the invention is shown. OTP memory 30 includes a data input field ("Data"); however, the address input field is split into two address input fields—"Address [2]" and "Address [1:0]." An inverse of "Data In" is received by a portion of the address input field. For example, the inverse of "Data In" is received by "Address [2]." The data input field "Data" is tied to the "Program" input so that data is programmed in the OTP memory 30 regardless of the "Data In." However, the program even occurs in the address field controlled by the "Address [2]" input field if the "Data In" input is low. In this embodiment, the OTP memory 30 is larger than is required, so a portion of the address input field can be utilized to mask the data input programmed into OTP memory 30.

Figure 3B:
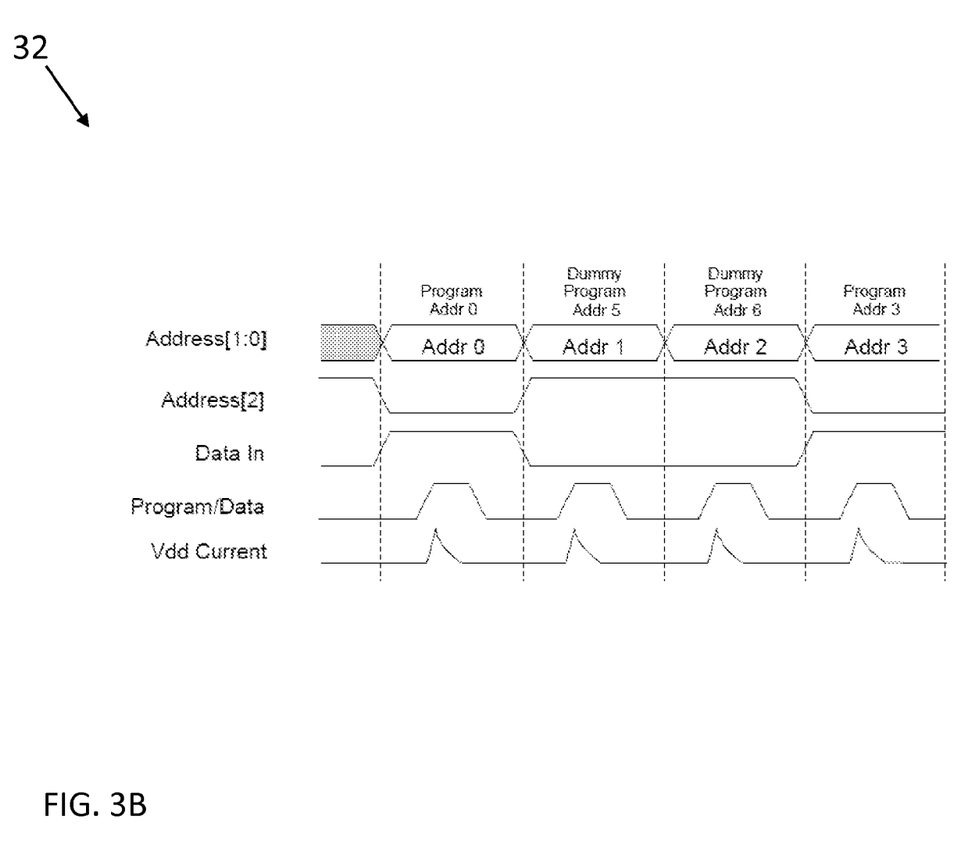
FIG. 3B shows a waveform sequence of an OTP memory according to embodiments of the invention.

As seen in the waveform sequence 32 of FIG. 3B, the current profile ("Vdd current") of OTP memory 30 is constant for all address input fields. By sacrificing address bit 2, Addr 0-Addr 3 are used to store real data ("Data In"), while Addr 4-Addr 7 (not shown) are used to provide a current load when real data is not being programmed.

Figure 4A:
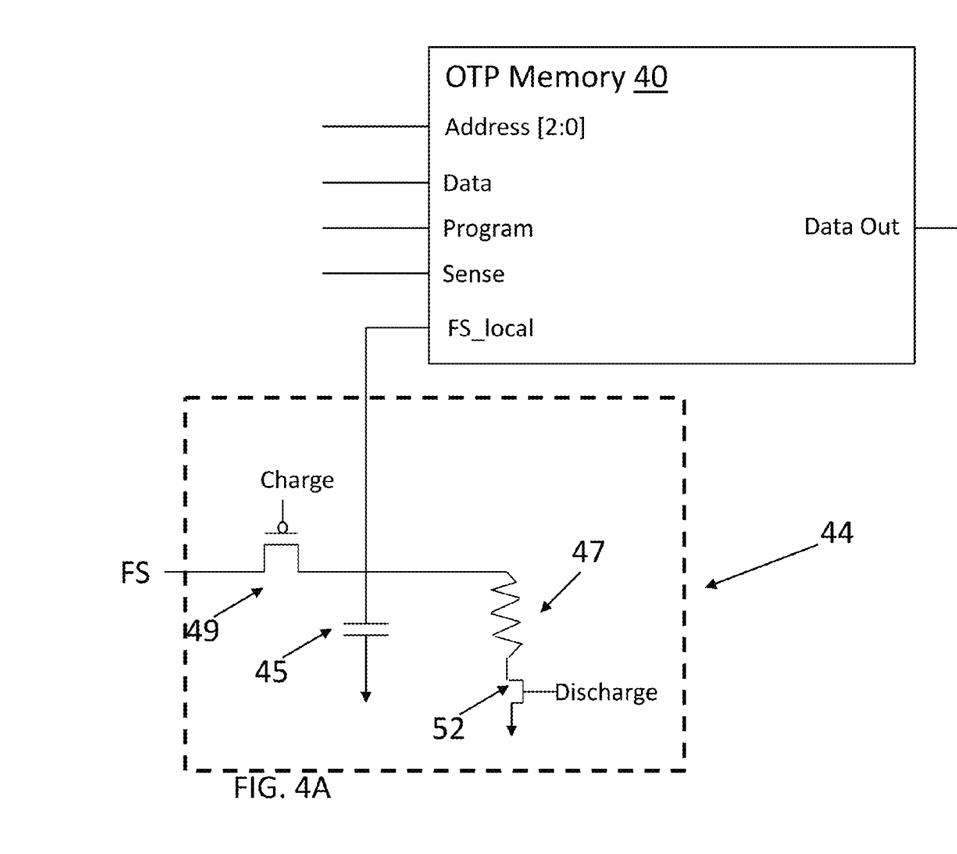
FIG. 4A shows a schematic view of an OTP memory according to embodiments of the invention.
Figure 4B:
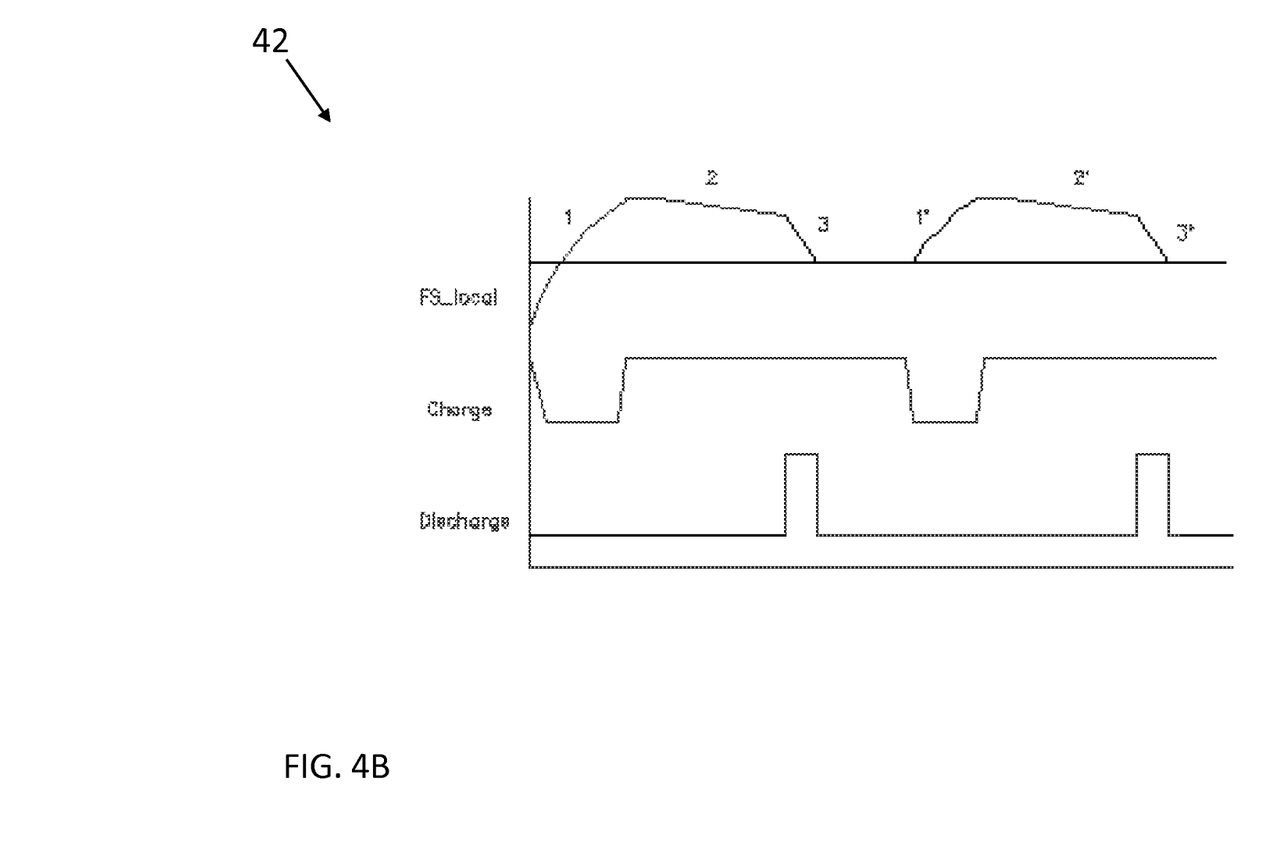
FIG. 4B shows a waveform sequence of an OTP memory according to embodiments of the invention.

Turning now to FIG. 4A, a OTP memory 40 according to embodiments of the invention is shown. OTP memory 40 includes all the inputs of convention OTP memory 10, shown in FIG. 1A. However, the fuse source input ("FS local") of the OTP memory 40 programmed by a circuit 44. The circuit 44 includes a transistor 49 that receives a fuse supply (FS) voltage to charge a programming capacitor 45. A discharge resistor 47 and transistor 52 are configured to discharge the programming capacitor 45. In this embodiment, a current profile for the FS voltage that is received by the fuse source input ("FS local") is a continuous charge-discharge cycle (via programming capacitor 45), as seen in the waveform sequence 42 of FIG. 4B, so that the data input that is programmed into the data input field of OTP memory 40 is undetectable.

In operation, programming capacitor 45 is fully charged while a data input is programmed into the data input field ("Data") and discharges after each programming step. It is understood that programming capacitor 45 would need to be a large capacitor and the exact size is based on the charge "Charge" used to program data input into the data input field.

Figure 5:
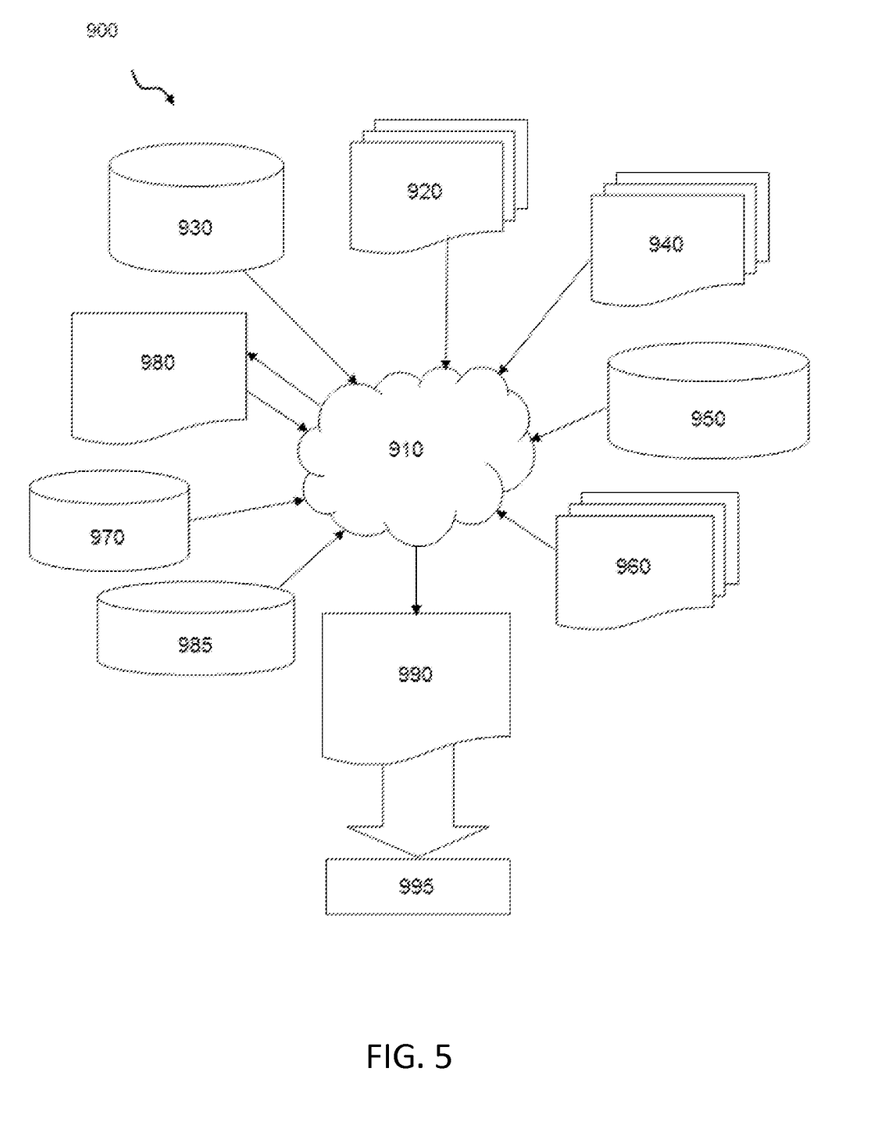
FIG. 5 shows a flow diagram of a design process used in semiconductor design, manufacture, and/or test according to embodiments of the invention.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4B. In one embodiment, design structure 990 may comprise a compiled, executable HDL simulation model that functionally simulates the devices shown in FIGS. 1-4B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4B. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit, comprising:
   a first one-time programmable (OTP) memory for receiving a data input for a plurality of address fields; and
   a second OTP memory for receiving an inverse of the data input for a plurality of address fields, wherein a current profile for a programming supply for the first OTP memory and the second OTP memory is masked, such that the data input for the first OTP memory is undetectable.

2. The circuit of claim 1, wherein a valid data output is provided by the first OTP memory.

3. The circuit of claim 1, further comprising a logic gate configured to receive a data output of the first OTP memory and a data output of the second OTP memory for verifying that the data output of the first OTP memory is valid.

4. The circuit of claim 1, wherein the first OTP memory and the second OTP memory receive a same address input.

5. The circuit of claim 1, wherein the first OTP memory and the second OTP memory receive a same programming input.

6. A one-time programmable (OTP) memory, comprising:
   an address input field; and
   a data input field,
   wherein the data input field receives a data input, and a portion of the address input field receives an inverse of the data input.

7. The OTP memory of claim 6, further comprising a system for masking a current profile for a programming supply for the OTP memory, such that the data input for the OTP memory is undetectable.

8. The OTP memory of claim 6, wherein half of the address input field receives the inverse of the data input.

9. A design structure tangibly embodied in a non-transitory machine readable storage medium for designing, manufacturing, or testing a circuit including one-time programmable (OTP) memories, the design structure comprising:
   a first one-time programmable (OTP) memory for receiving a data input for a plurality of address fields; and
   a second OTP memory for receiving an inverse of the data input for a plurality of address fields, wherein a current profile for a programming supply for the first OTP memory and the second OTP memory is masked, such that the data input for the first OTP memory is undetectable.

10. The design structure of claim 9, wherein a valid data output is provided by the first OTP memory.

11. The design structure of claim 9, further comprising a logic gate configured to receive a data output of the first OTP memory and a data output of the second OTP memory for verifying that the data output of the first OTP memory is valid.

12. The design structure of claim 9, wherein the first OTP memory and the second OTP memory receive a same address input and a same programming input.

13. The design structure of claim 9, wherein the design structure comprises a netlist.

14. The design structure of claim 9, wherein the design structure resides on the storage medium in a data format used for the exchange of layout data of integrated circuits.

* * * * *